United States Patent
Dolgin et al.

(10) Patent No.: US 10,340,965 B2
(45) Date of Patent: Jul. 2, 2019

(54) DIODE-BASED TRANSMITTER AND RECEIVER DETUNING CIRCUITS

(71) Applicant: RAYTHEON COMPANY, Waltham, MA (US)

(72) Inventors: Benjamin P. Dolgin, Alexandria, VA (US); Thomas Lavedas, Moneta, VA (US); Joseph J. Fraundorfer, Portsmouth, RI (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/964,477

(22) Filed: Apr. 27, 2018

(65) Prior Publication Data
US 2018/0316372 A1 Nov. 1, 2018

Related U.S. Application Data

(60) Provisional application No. 62/491,338, filed on Apr. 28, 2017.

(51) Int. Cl.
| | |
|---|---|
| *H04B 1/04* | (2006.01) |
| *H04B 1/14* | (2006.01) |
| *H03D 7/14* | (2006.01) |
| *H04B 1/10* | (2006.01) |

(52) U.S. Cl.
CPC .............. *H04B 1/14* (2013.01); *H03D 7/1408* (2013.01); *H04B 1/1018* (2013.01); *H04B 1/1027* (2013.01); *H03D 2200/0013* (2013.01); *H04B 2001/1072* (2013.01)

(58) Field of Classification Search
CPC ...... H04B 1/14; H04B 1/1018; H04B 1/1027; H04B 2001/1072; H03D 7/1408; H03D 2200/0013
See application file for complete search history.

(56) References Cited

U.S. PATENT DOCUMENTS

| | | | |
|---|---|---|---|
| 6,083,164 A | 7/2000 | Oppelt et al. | |
| 2003/0090317 A1* | 5/2003 | Mattisson | H03D 3/005 329/315 |
| 2009/0237081 A1* | 9/2009 | Biber | G01R 33/3628 324/322 |
| 2014/0265847 A1 | 9/2014 | Fox | |
| 2015/0098528 A1* | 4/2015 | Nowottnick | H04B 5/0068 375/320 |

FOREIGN PATENT DOCUMENTS

WO   2015138939 A1   9/2015

OTHER PUBLICATIONS

International Search Report and Written Opinion in Application No. PCT/US2018/029711 dated Dec. 19, 2018.

* cited by examiner

*Primary Examiner* — Dac V Ha
(74) *Attorney, Agent, or Firm* — Lando & Anastasi, LLP

(57) ABSTRACT

Examples of passive diode-based transmitter detuning circuits and low-voltage active diode-based and receiver detuning circuits are provided.

19 Claims, 5 Drawing Sheets

DIODE-BASED TRANSMITTER AND RECEIVER DETUNING CIRCUITS

CROSS-REFERENCE TO RELATED APPLICATIONS

This application claims the benefit under 35 U.S.C. § 119(e) of co-pending U.S. Provisional Application No. 62/491,338 filed on Apr. 28, 2017 and titled "DIODE-BASED TRANSMITTER AND RECEIVER DETUNING," which is herein incorporated by reference in its entirety for all purposes.

FEDERALLY SPONSORED RESEARCH

This invention was made with government support under Contract No. W911QY-17-C-0003 awarded by the Department of Defense. The U.S. government has certain rights in this invention.

BACKGROUND

In transceivers, transmitter and receiver detuning (sometimes termed de-Q-ing) can be required to prevent transmitter radiation from entering and desensitizing receiver circuitry and saturating the receiver preamplifier. In other words, during a transmit mode of operation of the transceiver, the receiver should be detuned so that signals from the transmitter are not received (or received at much lower power levels), and during a receive mode of operation, the transmitter should be detuned. Diodes are routinely used as bi-stable elements for detuning that are turned on or off by providing DC bias on the diodes. A conventional detuning circuit is shown in FIG. 1.

In the example of FIG. 1, the detuning circuit includes a pair of oppositely-oriented diodes 102, 104 connected to opposite ends of one side of a transformer 110. Receiver circuitry operates at very low voltages, and therefore for receiver detuning an external command voltage is applied to bias the diodes 102, 104. Accordingly, the detuning circuit further includes a power source 112, such as a battery, and switch 114 that selectively connects the power source 112 to the diodes 102, 104. The power source 112 is connected to the center tap of the transformer 110. For receiver detuning, the switch 114 is closed to actively bias the diodes 102, 104. The large current and voltages carried in the antenna 120 necessitate introduction of the transformer 110 to reduce power-handling requirements on the diodes 102, 104. Still, large bias voltages are required, making the detuning complicated. In addition, resistors 106, 108 are connected in series with the diodes 102, 104 to limit the DC current through the diodes 102, 104 when the switch 114 is closed. These resistors 106, 108 need to be relatively large (high resistive values) to avoid burn-out of the diodes, which is a disadvantage. In addition, the large parasitic capacitance of the diodes 102, 104 limits their usefulness.

SUMMARY OF THE INVENTION

As discussed above, transmitter and receiver detuning is necessary is certain applications. However, achieving detuning is not necessarily simple, and the problem is even more complicated when the difference between the receiver and transmitter power levels exceeds 200 dB, as is the case for near-field RF sensing used in remote chemical sensing applications, for example. Active diode detuning adversely complicates near-field sensing.

Aspects and embodiments are directed to configurations for diode-based transmitter and receiver detuning that avoid or overcome disadvantages associated with conventional approaches and/or offer improvements.

According to one embodiment, a passive transmitter detuning circuit comprises a first pair of diodes connected between a transmitter antenna and a first circuit terminal, the first pair of diodes includes a first diode and a second diode connected in parallel with the first diode, the first and second diodes being oriented oppositely to one another, a first resistor connected in parallel with the first pair of diodes between the transmitter antenna and the first circuit terminal, and a capacitor connected in parallel with the transmitter antenna between the first circuit terminal and a second circuit terminal.

In one example the passive transmitter detuning circuit further comprises a second pair of diodes, including a third diode connected in series with the first diode between the transmitter antenna and the first circuit terminal, and a fourth diode connected in series with the second diode between the transmitter antenna and the first circuit terminal, the third diode having a same orientation as the first diode and the fourth diode having a same orientation as the second diode, and a second resistor connected in parallel with the third and fourth diodes and in series with the first resistor.

According to another embodiment, a passive transmitter detuning circuit comprises a first plurality of diodes connected in series between a transmitter antenna and a first circuit terminal, each diode of the first plurality of diodes being connected with a first orientation, a corresponding second plurality of diodes connected in series between the transmitter antenna and the first circuit terminal, each diode of the second plurality of diodes being connected with a second orientation opposite to the first orientation, the second plurality of diodes being connected in parallel with the first plurality of diodes, a corresponding plurality of resistors connected in in series between the transmitter antenna and the first circuit terminal, each resistor of the plurality of resistors being connected in parallel with a respective one of the first plurality of diodes and a respective one of the second plurality of diodes, and a capacitor connected in parallel with the transmitter antenna between the first circuit terminal and a second circuit terminal.

According to another embodiment, a diode-based receiver detuning circuit comprises a first circuit branch connected in parallel with a receiver antenna between a first circuit terminal and a second circuit terminal, the first circuit branch including a first diode and a second diode connected in series with the first diode, the first and second diodes having opposite connection orientations, the first circuit branch further including a first current-limiting resistor connected between the first diode and a first junction node positioned between the first and second diodes, and a second current-limiting resistor connected between the second diode and the first junction node, a second circuit branch connected in parallel with the first circuit branch between the first and second circuit terminals, the second circuit branch including a third diode and a fourth diode connected in series with the third diode, the third and fourth diodes having opposite connection orientations, the second circuit branch further including a third current-limiting resistor connected between the third diode and a second junction node positioned between the third and fourth diodes, and a fourth current-limiting resistor connected between the fourth diode and the second junction node, a command input line connected between the first and second junction nodes, the command input line including a power source and a switch configured to selectively connect the power source to one of the first and second junction nodes, and a first capacitor connected in parallel with the first and second circuit branches between the first and second circuit terminals.

In one example of the diode-based receiver detuning circuit the command input line further includes a resistor connected in series between the switch and the power source. Examples of the diode-based receiver detuning circuit may further comprise a second capacitor connected in parallel with the command input line between the first and second junction nodes. In one example the power source is a battery. In another example the first and third diodes are connected to the first circuit terminal and the second and fourth diodes are connected to the second circuit terminal, wherein the first and third diodes have opposite connection orientations and the second and fourth diodes have opposite connection orientations. In another example when the switch is closed, the receiver detuning circuit is operable to reduce a Q of the receiver antenna to detune the receiver antenna.

According to another embodiment, a receiver sub-system comprises a transformer, a receiver antenna connected to the transformer, and a diode-based receiver detuning circuit. The diode-based receiver detuning circuit includes a pair of diodes connected in series with one another to the transformer and with opposite connection orientations to one another, a command input line connected between a center tap of the transformer and a junction node positioned between first and second diodes of the pair of diodes, the command input line including a power source and a switch operable to connect the power source to one of the junction node and the center tap of the transformer, a first resistor connected in series between the first diode and the junction node, and a second resistor connected in series between the junction node and the second diode.

In one example of the receiver sub-system when the switch is closed the receiver detuning circuit is operable to reduce a Q of the receiver antenna to detune the receiver antenna. In another example the receiver antenna is connected to a first winding of the transformer and the receiver detuning circuit is connected to a second winding of the transformer. In another example pair of diodes is connected in series between first and second circuit terminals connected to the second winding of the transformer, and further comprising a first capacitor connected in parallel with the pair of diodes between the first and second circuit terminals. The command input line may further include a third resistor connected in series with the switch and the power source. The receiver sub-system may further comprise a second capacitor connected in parallel with the command input line between the center tap of the transformer and the junction node. In one example the receiver antenna and the receiver detuning circuit are connected to a common winding of the transformer. The receiver sub-system may further comprise a first capacitor connected in parallel with the pair of diodes. In one example the command input line further includes a third resistor connected in series with the switch and the power source. The receiver sub-system may further comprise a second capacitor connected in parallel with the command input line between the center tap of the transformer and the junction node.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

According to certain aspects and embodiments, the transmitter and receiver antennas are separated and detuning is provided for each. Embodiments provide a passive detuning element for the transmitter antenna, and a low-voltage active detuning circuit for the receiver antenna. As discussed further below, resistor arrangements are provided that compensate for parasitic capacitance of the diodes. In addition, certain embodiments include resistor and/or capacitor arrangements to optimize energy absorption.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, above and below, and vertical and horizontal are intended for convenience of description, not to limit the present systems and methods or their components to any one positional or spatial orientation.

Figure 1:
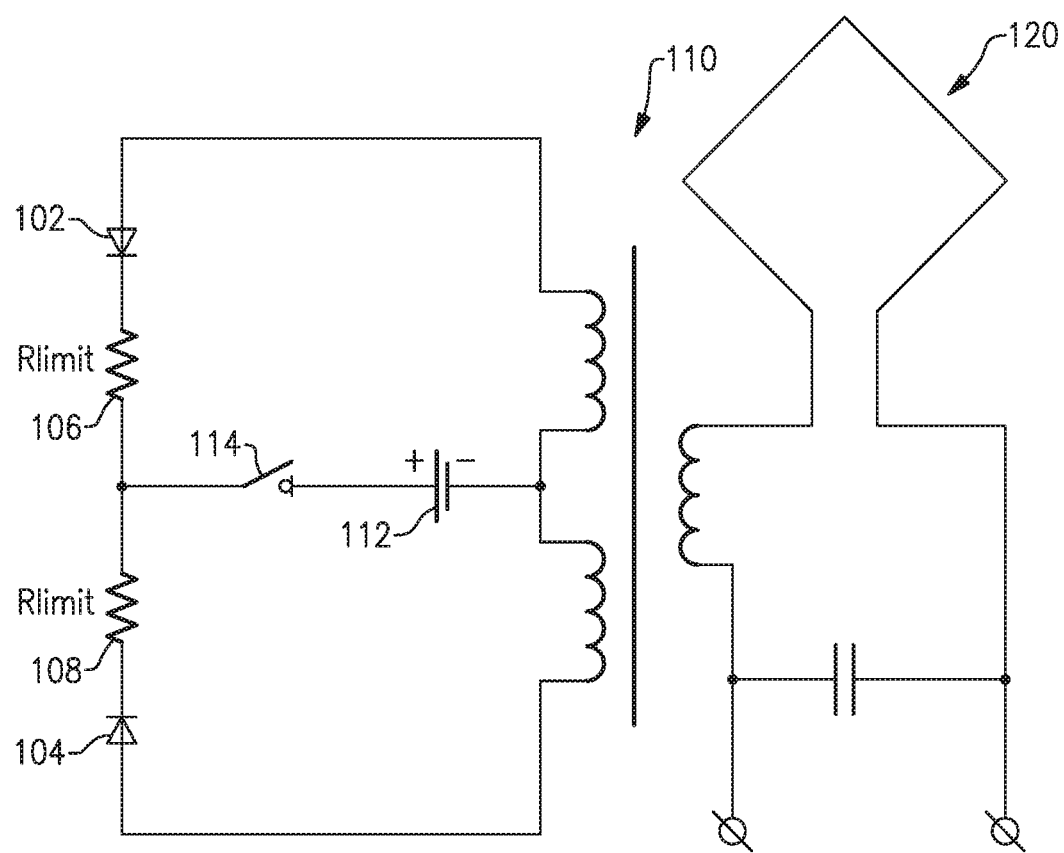
FIG. 1 is a simplified circuit diagram of an example of a conventional detuning circuit.
Figure 2A:
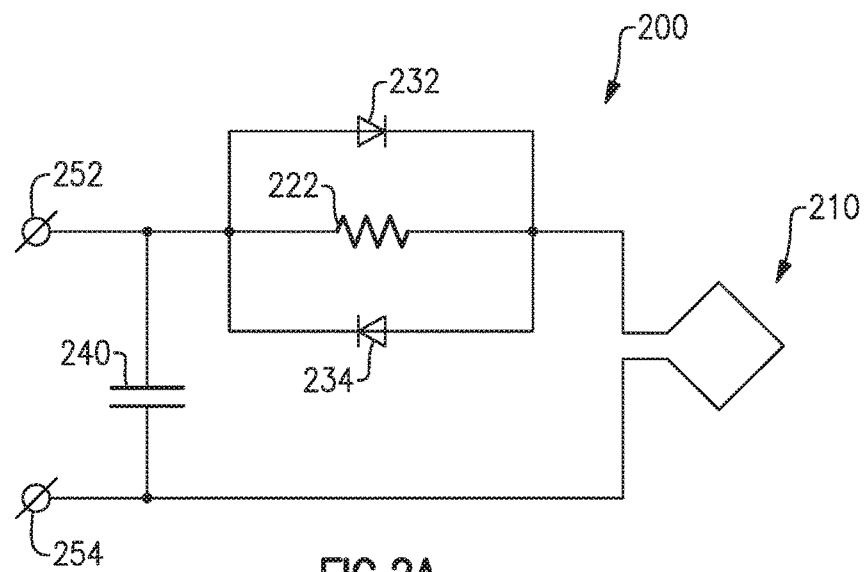
FIG. 2A is a simplified circuit diagram of one example of a passive transmitter detuning circuit according to aspects of the present invention.
Figure 2B:
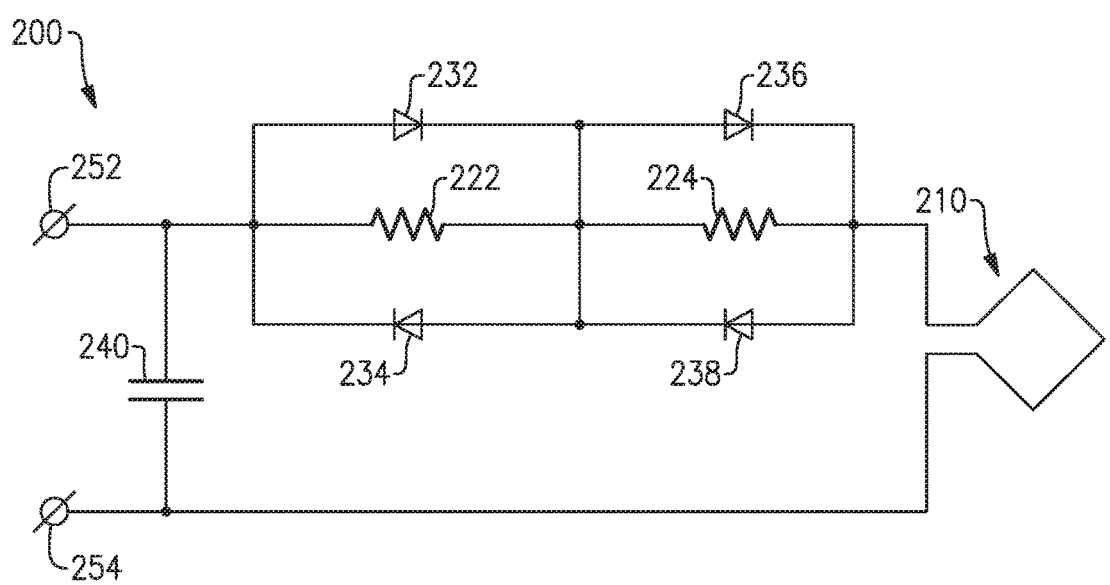
FIG. 2B is a simplified circuit diagram showing a variation on the passive transmitter detuning circuit of FIG. 2A according to aspects of the present invention.

Certain embodiments are directed to a fully passive transmitter detuning circuit (also called a detuner). FIGS. 2A and 2B illustrate examples of a fully passive transmitter detuner 200 according to certain embodiments. The detuning elements of the detuner 200 connected to a transmitter antenna 210 include a resistor 222 and a pair of diodes 232, 234 connected in parallel with the resistor 220. As shown in FIG. 2A, the diodes 232, 234 are oriented in opposite directions. The detuner 200 further includes a capacitor 240 connected across terminals 252, 254 of the detuner 200. When high power is applied to the detuner circuit 200, as may be the case when the transmitter antenna 210 is active (transmitting), the high voltage opens the diodes 232, 234 and their resistance drops to near zero (and the detuner 200 has a high Q). In this state the circuit 200 is tuned. When power levels are low, or power is not applied to the circuit, the diodes 232, 234 are closed and their resistance detunes the circuit (and the detuner 200 has a low Q). However, the closed diodes 232, 234 have high parasitic capacitance, which if left uncompensated for can severely reduce the losses in the diodes 232, 234 at high frequencies. Accordingly, as shown in FIG. 2A, the resistor 222 is connected in parallel with the diodes 232, 234 to compensate for this parasitic capacitance. At high power, the diodes 232, 234 conduct, thereby shorting the resistor 222. When power is removed (or the power level is low), the resistor 222 diverts the current from diodes 232, 234 and increases the rate at which power is dissipated (i.e., detuning). This arrangement can considerably enhance transceiver performance in the receive mode because the transmitter can be well detuned. An additional benefit is that the resistor 222 may reduce ringing in the detuning circuit 200 when the voltage on the resistor 222 is very close to the voltage at which the diodes 232, 234 begin to conduct.

In some instances, multiple pairs of diodes 232, 234 may be included to handle the transmitter current. Accordingly, FIG. 2B shows an example of the detuner 200 including two pairs of diodes, each pair connected in parallel with an associated resistor. Thus, in the example shown in FIG. 2B, the circuit 200 further includes third and fourth diodes 236, 238 connected in parallel with a second resistor 224. The diodes are oriented such that the first diode 232 and the third diode 236 have the same orientation, and the second diode 234 and the fourth diode 238 have the same orientation, opposite to that of the first and third diodes. Thus, the diodes in each "arm" or "branch" of the circuit have the same orientation, and the second pair of diodes 236, 238 (and its associated resistor 224) is connected in series with the first pair of diodes 232, 234 (and its associated resistor 222) between the transmitter antenna 210 and the terminal 252. Those skilled in the art will readily appreciate, given the benefit of this disclosure, that the circuit 200 can be further modified to include one or more additional pair(s) of diodes and associated resistor(s) connected in series between the transmitter antenna 210 and the terminal 252.

As discussed above, further aspects and embodiments are directed to an active receiver detuning circuit. FIGS. 3A-4C illustrate examples of a receiver detuning circuit 300 according to certain embodiments connected to a receiver antenna 310.

Figure 3A:
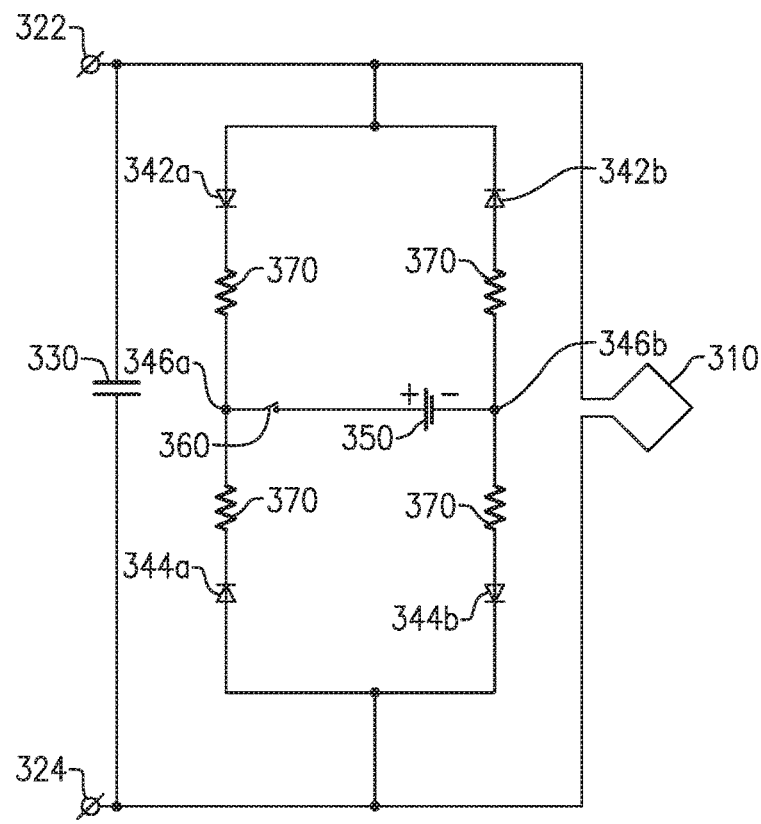
FIG. 3A is a simplified circuit diagram of one example of an active receiver detuning circuit according to aspects of the present invention.

Referring to FIG. 3A, in certain embodiments, the receiver detuning circuit 300 includes two parallel branches connected in parallel with each other and with the receiver antenna 310 between first and second circuit terminals 322, 324. The circuit 300 further includes a capacitor 330 connected in parallel between the first and second circuit terminals 322, 324. Each circuit branch includes a pair of diodes 342, 344 oriented in opposite directions and connected in series. Corresponding diodes in the first and second branches (e.g., 342a and 342b, or 344a and 344b) are also oppositely connected, as shown in FIG. 3A. The diode pairs can be placed at the output of the receiver antenna, or in the case of a loop antenna, connected in parallel with the receiver antenna 310, as shown in FIG. 3A, for example. Receiver circuitry may generally operate at very low voltages, and therefore, to detune the receiver circuit 300, an external command voltage may be applied to the diode pairs. Accordingly, the receiving detuning circuit 300 further includes a "command input line" that, in the illustrated example, includes a power source 350, such as a battery, for example, and a switch 360. The power source 350 is switchably connected between the two circuit branches by the switch 360. The power source 350 is connected to nodes 346a, 346b positioned between the two diodes 342, 344 of each pair. When the diode pair of each circuit branch is unbiased (i.e., switch 360 is open) its resistance is very high and the receiver antenna 310 has a high Q. When a bias voltage is placed on the junction of the diodes, by closing the switch 360 and connecting the power source 350, the diodes 342a, 342b, 344a, 344b are open and the Q of the receiver antenna 310 drops significantly.

Embodiments of the receiver detuning circuit 300 further include several resistors to limit the current through the diodes 342a, 342b, 344a, and 344b, and to introduce power dissipation as a compensation for parasitic capacitance of the diodes. In the example shown in FIG. 3A, each diode 342a, 342b, 344a, and 344b is connected to one of the nodes 346a or 346b via a corresponding resistor 370. These resistors 370 connected in series with the diodes in each circuit branch limit the DC current through the diodes when a command to open is issued (i.e., the switch 360 is turned on). However, in some instances, these resistors 370 may need to be relatively large to prevent the diodes 342a, 342b, 344a, and 344b from burning out. Accordingly, certain embodiments separate the functions of current limiting and detuning by including one or more additional resistors.

Figure 3B:
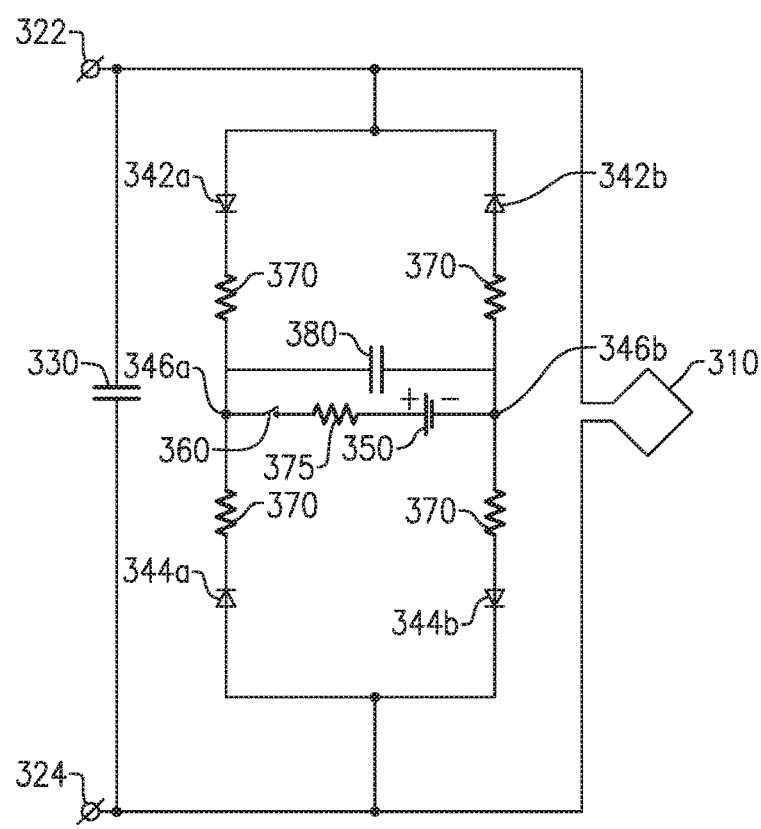
FIG. 3B is a simplified circuit diagram of another example of an active receiver detuning circuit according to aspects of the present invention.

For example, FIG. 3B shows another configuration of the receiver detuning circuit 300. In this example, the circuit includes an additional resistor 375 connected in series with the power source 350 and the switch 360 in the command input line between the two branches of the circuit. This additional resistor 375 assists with detuning the receiver antenna 310, while the resistors 370 perform the current limiting function discussed above. In addition, in certain embodiments, a capacitor 380 is connected in parallel with the command input line, as also shown in FIG. 3B. The capacitor 380 reduce ringing that may occur due to the diodes 342a, 342b, 344a, and 344b opening and closing at the resonant frequency of the receiver circuit.

Figure 4A:
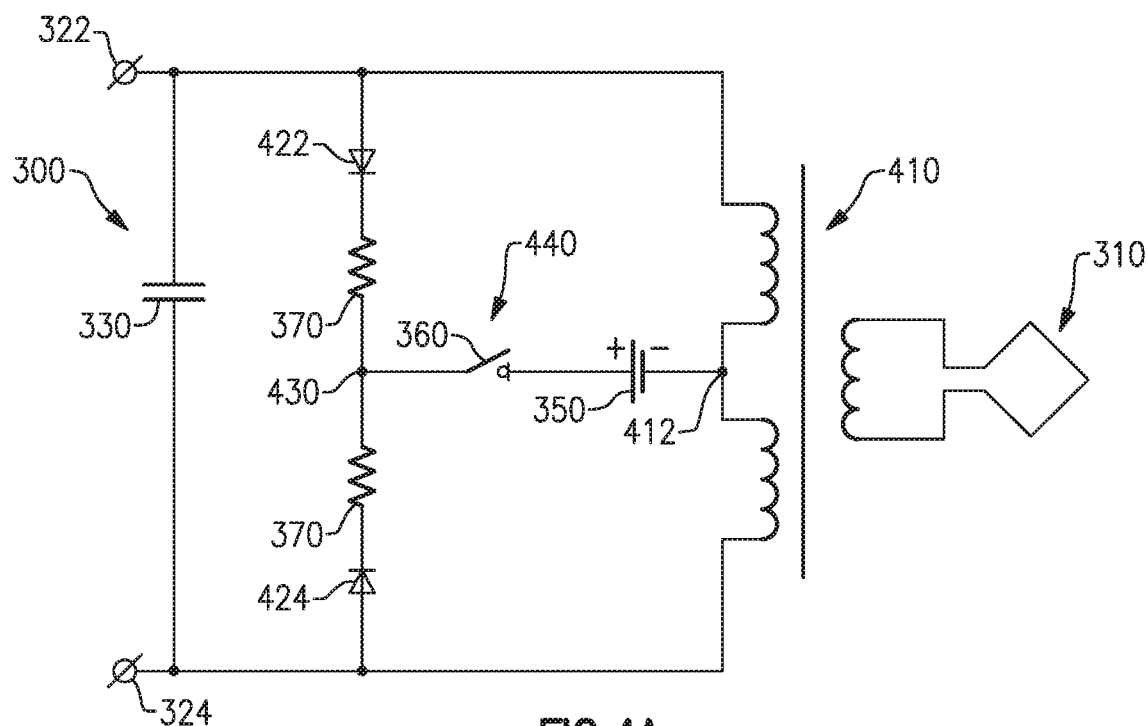
FIG. 4A is a simplified circuit diagram of an example of an active receiver detuning circuit according to aspects of the present invention, in which the receiver antenna is connected to a transformer.
Figure 4B:
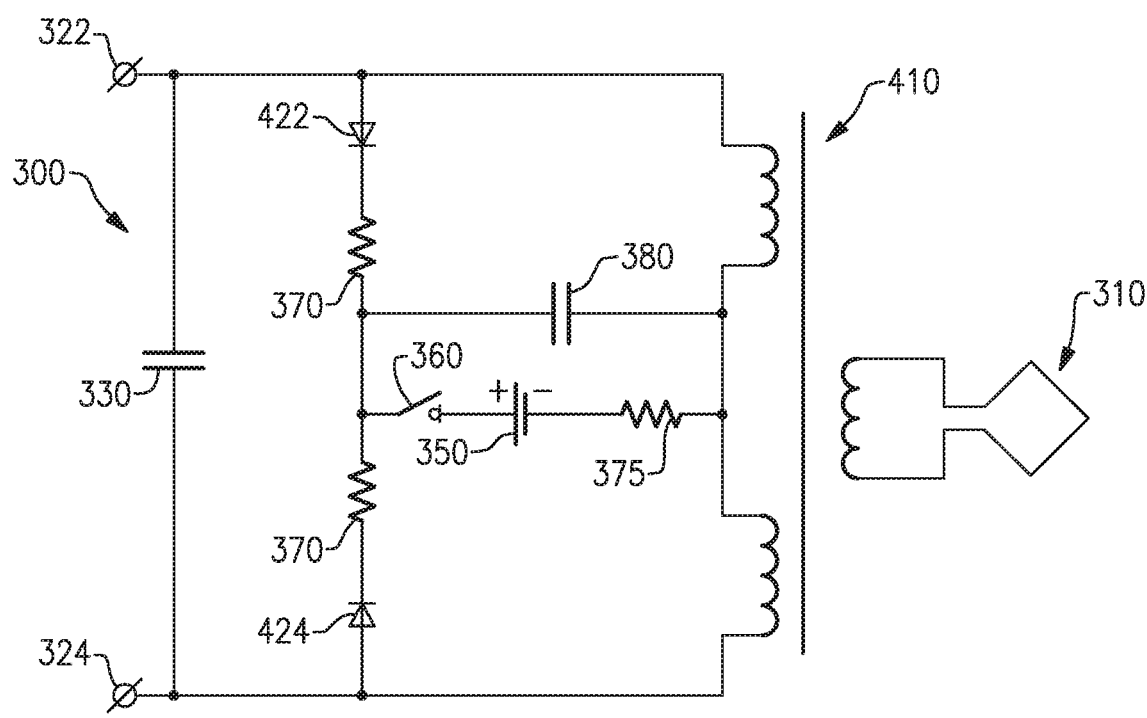
FIG. 4B is a simplified circuit diagram of another example of an active receiver detuning circuit according to aspects of the present invention, in which the receiver antenna is connected to a transformer.
Figure 4C:
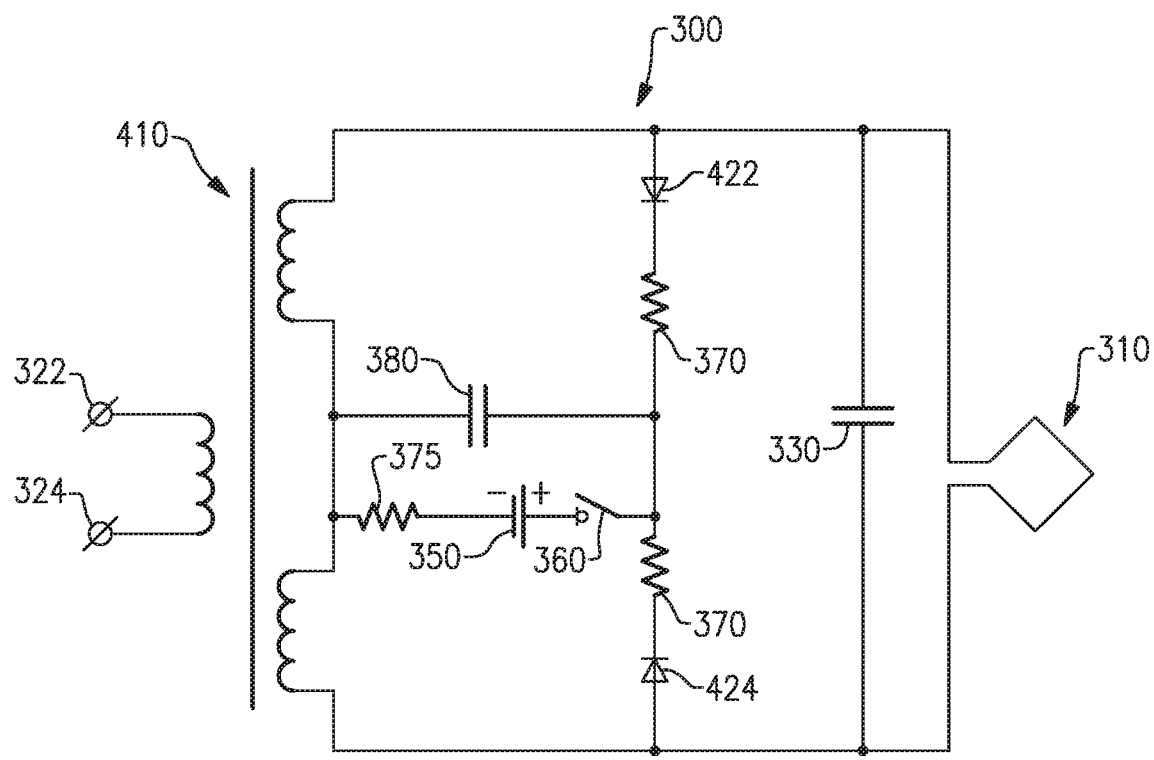
FIG. 4C is a simplified circuit diagram of another example of an active receiver detuning circuit according to aspects of the present invention, in which the receiver antenna is connected to a transformer.

FIGS. 4A-C illustrate additional examples of the receiver detuning circuit 300 in which the receiver antenna 310 is connected to a transformer 410. Referring to FIG. 4A, in this example the receiver detuning circuit 300 includes a pair of diodes 422, 424 oppositely connected in series between the first and second circuit terminals 322, 324. Each diode 422, 424 is connected to a junction node 430 positioned between the two diodes by a respective resistor 370, similar to the arrangement shown in FIGS. 3A and 3B and discussed above. The receiver detuning circuit 300 further includes the "command input line" 440 connected to the node 430 and to a center tap 412 on the transformer 410. As discussed above, the command input line includes the power source 350 and switch 360 that selectively bias the diodes 422, 424. The capacitor 330 is connected in parallel with the pair of diodes 422, 424 (and their associated resistors 370) between the circuit terminals 322, 234 as shown.

Referring to FIG. 4B, as discussed above, in certain examples the command input line 440 includes the additional resistor 375 such that the functions of receiver antenna detuning (performed by the additional resistor 375 in combination with the diodes 422, 424) and current limiting (performed by the resistors 370) can be advantageously separated. In addition, in certain examples, the receiver detuning circuit 300 may include the capacitor 380 connected in parallel with the command input line 340 between the center tap 412 of the transformer 410 and the junction node 430 between the two diodes 422, 424, as shown in FIG. 4B, to reduce ringing, as discussed above.

In the examples shown in FIGS. 4A and 4B, the receiver antenna 310 is connected on an opposite side (winding) of the transformer 410 to than the detuning circuit 300. However, this need not be the case. FIG. 4C illustrates an example in which the receiver detuning circuit 300 and the receiver antenna 310 are connected on the same side of the transformer 410. The receiver detuning circuit 300 functions the same in either case.

Thus, aspects and embodiments provide passive transmitter detuning circuits and low-voltage active receiver detuning circuits. The detuning circuits are diode-based, and include resistor arrangements to compensate for parasitic capacitance of the diodes. In addition, embodiments of the detuning circuits may include resistor and capacitor arrangements configured to optimize energy absorption and reduce ringing associated with switching the diodes at or near the resonant frequency of the circuit.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims and their equivalents.

What is claimed is:

1. A passive transmitter detuning circuit comprising:
a first pair of diodes connected between a transmitter antenna and a first circuit terminal, the first pair of diodes includes a first diode and a second diode connected in parallel with the first diode, the first and second diodes being oriented oppositely to one another;
a first resistor connected in parallel with the first pair of diodes between the transmitter antenna and the first circuit terminal; and
a capacitor connected in parallel with the transmitter antenna between the first circuit terminal and a second circuit terminal.

2. The passive transmitter detuning circuit of claim 1 further comprising:
a second pair of diodes, including a third diode connected in series with the first diode between the transmitter antenna and the first circuit terminal, and a fourth diode connected in series with the second diode between the transmitter antenna and the first circuit terminal, the third diode having a same orientation as the first diode and the fourth diode having a same orientation as the second diode; and
a second resistor connected in parallel with the third and fourth diodes and in series with the first resistor.

3. A passive transmitter detuning circuit comprising:
a first plurality of diodes connected in series between a transmitter antenna and a first circuit terminal, each diode of the first plurality of diodes being connected with a first orientation;
a corresponding second plurality of diodes connected in series between the transmitter antenna and the first circuit terminal, each diode of the second plurality of diodes being connected with a second orientation opposite to the first orientation, the second plurality of diodes being connected in parallel with the first plurality of diodes;
a corresponding plurality of resistors connected in in series between the transmitter antenna and the first circuit terminal, each resistor of the plurality of resistors being connected in parallel with a respective one of the first plurality of diodes and a respective one of the second plurality of diodes; and
a capacitor connected in parallel with the transmitter antenna between the first circuit terminal and a second circuit terminal.

4. A diode-based receiver detuning circuit comprising:
a first circuit branch connected in parallel with a receiver antenna between a first circuit terminal and a second circuit terminal, the first circuit branch including a first diode and a second diode connected in series with the first diode, the first and second diodes having opposite connection orientations, the first circuit branch further including a first current-limiting resistor connected between the first diode and a first junction node positioned between the first and second diodes, and a second current-limiting resistor connected between the second diode and the first junction node;
a second circuit branch connected in parallel with the first circuit branch between the first and second circuit terminals, the second circuit branch including a third diode and a fourth diode connected in series with the third diode, the third and fourth diodes having opposite connection orientations, the second circuit branch further including a third current-limiting resistor connected between the third diode and a second junction node positioned between the third and fourth diodes, and a fourth current-limiting resistor connected between the fourth diode and the second junction node;
a command input line connected between the first and second junction nodes, the command input line including a power source and a switch configured to selectively connect the power source to one of the first and second junction nodes; and
a first capacitor connected in parallel with the first and second circuit branches between the first and second circuit terminals.

5. The diode-based receiver detuning circuit of claim 4 wherein the command input line further includes a resistor connected in series between the switch and the power source.

6. The diode-based receiver detuning circuit of claim 5 further comprising a second capacitor connected in parallel with the command input line between the first and second junction nodes.

7. The diode-based receiver detuning circuit of claim 4 wherein the power source is a battery.

8. The diode-based receiver detuning circuit of claim 4 wherein the first and third diodes are connected to the first circuit terminal and the second and fourth diodes are connected to the second circuit terminal, wherein the first and third diodes have opposite connection orientations and the second and fourth diodes have opposite connection orientations.

9. The diode-based receiver detuning circuit of claim 4 wherein when the switch is closed, the receiver detuning circuit is operable to reduce a Q of the receiver antenna to detune the receiver antenna.

10. A receiver sub-system comprising:
a transformer;
a receiver antenna connected to the transformer; and
a diode-based receiver detuning circuit including:
 a pair of diodes connected in series with one another to the transformer and with opposite connection orientations to one another;
 a command input line connected between a center tap of the transformer and a junction node positioned between first and second diodes of the pair of diodes, the command input line including a power source and a switch operable to connect the power source to one of the junction node and the center tap of the transformer;
 a first resistor connected in series between the first diode and the junction node; and
 a second resistor connected in series between the junction node and the second diode.

11. The receiver sub-system of claim 10 wherein when the switch is closed the receiver detuning circuit is operable to reduce a Q of the receiver antenna to detune the receiver antenna.

12. The receiver sub-system of claim 10 wherein the receiver antenna is connected to a first winding of the transformer and the receiver detuning circuit is connected to a second winding of the transformer.

13. The receiver sub-system of claim 12 wherein the pair of diodes is connected in series between first and second circuit terminals connected to the second winding of the transformer, and further comprising a first capacitor connected in parallel with the pair of diodes between the first and second circuit terminals.

14. The receiver sub-system of claim 13 wherein the command input line further includes a third resistor connected in series with the switch and the power source.

15. The receiver sub-system of claim 14 further comprising a second capacitor connected in parallel with the command input line between the center tap of the transformer and the junction node.

16. The receiver sub-system of claim 10 wherein the receiver antenna and the receiver detuning circuit are connected to a common winding of the transformer.

17. The receiver sub-system of claim 16 further comprising a first capacitor connected in parallel with the pair of diodes.

18. The receiver sub-system of claim 17 wherein the command input line further includes a third resistor connected in series with the switch and the power source.

19. The receiver sub-system of claim 18 further comprising a second capacitor connected in parallel with the command input line between the center tap of the transformer and the junction node.

* * * * *